US009343486B2

(12) United States Patent
Lee et al.

(10) Patent No.: US 9,343,486 B2
(45) Date of Patent: May 17, 2016

(54) LIGHT EMITTING DISPLAY DEVICE HAVING AUXILIARY WIRE BURIED IN SUBSTRATE AND METHOD OF MANUFACTURING THE SAME

(71) Applicant: Electronics and Telecommunications Research Institute, Daejeon (KR)

(72) Inventors: Jonghee Lee, Daejeon (KR); Jeong Ik Lee, Daejeon (KR); Doo-Hee Cho, Daejeon (KR); Jong Tae Lim, Seoul (KR); Ji-Young Oh, Daejeon (KR); Joo Yeon Kim, Daejeon (KR); Byoung Gon Yu, Yeongdong-gun (KR); Hyunkoo Lee, Daejeon (KR); Jun-Han Han, Daejeon (KR); Hye Yong Chu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 40 days.

(21) Appl. No.: 14/449,204

(22) Filed: Aug. 1, 2014

(65) Prior Publication Data

US 2015/0214452 A1   Jul. 30, 2015

(30) Foreign Application Priority Data

Jan. 28, 2014   (KR) ........................ 10-2014-0010608

(51) Int. Cl.
| H01L 27/32 | (2006.01) |
| H01L 51/52 | (2006.01) |
| H01L 51/56 | (2006.01) |
| H01L 27/12 | (2006.01) |
| H01L 51/00 | (2006.01) |

(52) U.S. Cl.
CPC .......... *H01L 27/1259* (2013.01); *H01L 27/124* (2013.01); *H01L 27/1218* (2013.01); *H01L 27/3276* (2013.01); *H01L 51/003* (2013.01); *H01L 51/0096* (2013.01); *H01L 51/5228* (2013.01); *H01L 51/5271* (2013.01)

(58) Field of Classification Search
CPC .................................................. H01L 27/3297
See application file for complete search history.

(56) References Cited

U.S. PATENT DOCUMENTS

| 7,116,044 | B2 * | 10/2006 | Fukunaga | ........... | H01L 27/3244 |
| | | | | | 313/498 |
| 7,170,506 | B2 | 1/2007 | Eldon et al. | | |
| 7,326,966 | B2 * | 2/2008 | Kang | .................. | H01L 51/5203 |
| | | | | | 257/72 |
| 2008/0219005 | A1 * | 9/2008 | Fukuda | ............... | H01L 51/5271 |
| | | | | | 362/284 |
| 2009/0066236 | A1 * | 3/2009 | Sung | ................... | H01L 27/3279 |
| | | | | | 313/504 |
| 2011/0267279 | A1 | 11/2011 | Alvarez Rivera et al. | | |

(Continued)

FOREIGN PATENT DOCUMENTS

| KR | 10-2013-0130609 | 12/2013 |
| KR | 10-2014-0081921 | 7/2014 |

*Primary Examiner* — Stephen W Smoot
(74) *Attorney, Agent, or Firm* — Rabin & Berdo, P.C.

(57) ABSTRACT

Provided is a display device and a method of manufacturing the same. The display device includes a thin film transistor, a first electrode electrically connected to the thin film transistor, a self-light emitting pixel layer disposed on the first electrode, a second electrode disposed on the self-light emitting pixel layer, a substrate in which an auxiliary wire is buried, the substrate being disposed on the second electrode, and a reflective pixel layer disposed on the substrate.

12 Claims, 7 Drawing Sheets

(56) References Cited

U.S. PATENT DOCUMENTS

| | | | |
|---|---|---|---|
| 2012/0267643 A1* | 10/2012 | Yim | H01L 27/326 257/88 |
| 2013/0314633 A1 | 11/2013 | Koo et al. | |
| 2013/0314634 A1 | 11/2013 | Koo et al. | |
| 2014/0145152 A1* | 5/2014 | Chung | H01L 27/3206 257/40 |
| 2014/0158997 A1 | 6/2014 | Ahn et al. | |

\* cited by examiner

LIGHT EMITTING DISPLAY DEVICE HAVING AUXILIARY WIRE BURIED IN SUBSTRATE AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2014-0010608, filed on Jan. 28, 2014, the entire contents of which are hereby incorporated by reference.

BACKGROUND OF THE INVENTION

The present invention disclosed herein relates to a display device and a method of manufacturing the same, and more particularly, to a display device including a self-light emitting pixel layer and a reflective pixel layer and a method of manufacturing the same.

In existing display technologies, displays may be classified into transmissive displays, self-light emitting displays, and reflective displays. Representative examples of the transmissive displays may include thin film transistor liquid crystal (TFTLCDs). Since such a TFTLCD has superior image quality, TFTLCD may be widely used for televisions (TVs), monitors and cell phones and lead display markets. However, the TFTLCD has drawbacks in that it has high power consumption and consumes high capacity of electricity and is not flexible.

Representative examples of the self-light emitting displays may include organic light-emitting diodes (OLEDs) and plasma display panels (PDPs). Since such a self-light emitting display emits light from its pixel itself, the self-light emitting display may have a fast response speed, a high contrast ratio, and superior color reproduction when compared to that of an LCD. Also, since such an OLED is capable of being manufactured with an ultra-thin thickness, the OLED is being applied into flexible displays and transparent displays.

The reflective displays may include electrophoretic displays, electro wetting displays, and microelectromechanical systems. Such a reflective display may be driven by reflecting external light such as sunlight or electric light. Thus, the reflective display may realize a clearer image when its surrounding is brighter. Also, since the reflective display is driven by the external light, the reflective display may have low power consumption. However, the reflective display may have relatively poor image quality when compared to those of the transmissive display and the self-light emitting display.

Each of the transmissive display and the self-light emitting display may have a clearer image at the indoor places or dark places. However, each of the transmissive display and the self-light emitting display may be deteriorated in visibility at the outdoor places or bright places. Thus, studies with respect to displays that provide clear images at the indoor or outdoor places and have low power consumption are being conducted.

For example, there is a structure in which a switching layer that is switchable between a transparent state and an opaque state is disposed between a transparent OLED and a background reflector. However, since the switching layer does not operate for each pixel, but equally operate on the overall pixels, the display may not be realized as a complete reflective display, but serve as only a supporter for supplementing an OLED screen by using a reflection function. That is, the display may not realize a moving picture having various colors, but realize an image having a simple color and shape such as a color of a wallpaper or a corporate logo. Also, there is a transflective display in which an LCD that is the transmissive display is combined with a reflective device as a representative dual mode display to which the reflective display is coupled. Generally, the dual mode LCD display may have a structure in which the reflective device such as a mirror is added to a structure that is equal to that of the normal LCD. When a backlight is turned off, external light is reflected by a mirror through a liquid crystal to serve as the reflective display. On the other hand, when the backlight is turned on, the dual mode LCD display operates with the same function as the general LCD to serve as the transmissive display. However, it is difficult to realize the flexible display because it is based on the liquid crystal.

In a case where the self-light emitting pixels are manufactured, and then the reflective pixels are successively formed on the self-light emitting pixels when the dual mode display including the self-light emitting and reflective pixels is manufactured, the self-light emitting pixels may be degraded during the reflective pixel manufacturing process. Thus, it is advantageous to utilize a process of bonding the pixels to each other. The most important thing is to maintain flatness of the bonding surface when the self-light emitting and the reflective pixels are bonded to each other. On the other hand, in a case of a carbon-based transparent electrode and an inorganic-based transparent electrode, which are highly likely to be used as upper electrodes of the display, the each of the carbon-based transparent electrode and the inorganic-based transparent electrode may have high surface resistance. Thus, to introduce the carbon-based transparent electrode and the inorganic-based transparent electrode into large-scale panels, a technology for reducing the surface resistance such as low-resistance auxiliary wires has to be introduced. However, if such a low-resistance auxiliary wire is introduced, a height difference may occur by a height of the auxiliary wire. Thus, due to the height difference, there is a limitation in bonding of the self-light emitting pixel and the reflective pixel.

SUMMARY OF THE INVENTION

The present invention provides a display device in which optical and electrical characteristics are improved.

The present invention also provides a method of manufacturing the display device.

The object of the present invention is not limited to the aforesaid, but other objects not described herein will be clearly understood by those skilled in the art from descriptions below.

Embodiments of the present invention provide display devices including: a thin film transistor; a first electrode electrically connected to the thin film transistor; a self-light emitting pixel layer disposed on the first electrode; a second electrode disposed on the self-light emitting pixel layer; a substrate in which an auxiliary wire is buried, the substrate being disposed on the second electrode; and a reflective pixel layer disposed on the substrate.

In some embodiments, the substrate may include polyimide, poly(ethyleneterephtalate) (PET), polycarbonate (PC), and poly(ethylene naphtahlate)(PEN).

In other embodiments, the substrate may have transmittance of about 80% or more.

In still other embodiments, a surface of the substrate contacting the self-light emitting pixel layer may have roughness of about 5 nm or less, and a peak-to-valley height of about 20 nm or less.

In even other embodiments, the auxiliary wire may include aluminum (Al), silver (Ag), chromium (Cr), copper (Cu), silver nanowire (AgNW), a carbon fiber, or a graphene composite.

In yet other embodiments, the reflective pixel layer may include a plurality of pixel patterns, and the auxiliary wire is disposed between the pixel patterns that are adjacent to each other.

In further embodiments, the auxiliary wire may have surface resistance of about 10 ohm/sq or less.

In still further embodiments, the auxiliary wire may have a height of about 0.1 μm to about 10 μm and a width of about 0.1 μm to about 500 μm.

In other embodiments of the present invention, methods of manufacturing a display device include: forming auxiliary wires on a support substrate; forming a first substrate filled between the auxiliary wires; forming a reflective pixel on the first substrate; forming a second substrate in which the reflective pixel is buried; removing the support substrate to expose one side of each of the auxiliary wires; forming a first electrode on the first substrate through which the one side of the auxiliary wire is exposed; successively laminating a thin film transistor, a second electrode, and a self-light emitting pixel layer; and disposing the first electrode on the self-light emitting pixel layer.

In some embodiments, the auxiliary wires may be formed on the support substrate through a thermal deposition, sputtering, or printing process.

In other embodiments, the forming of the first substrate filled between the auxiliary wires may include: applying a curable polymer on the support substrate in which the auxiliary wire is formed; and curing the curable polymer to form the first substrate.

In still other embodiments, the forming of the second substrate in which the reflective pixel is buried may include: applying a curable polymer on the first substrate in which the reflective pixel is formed; and curing the curable polymer to form the second substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
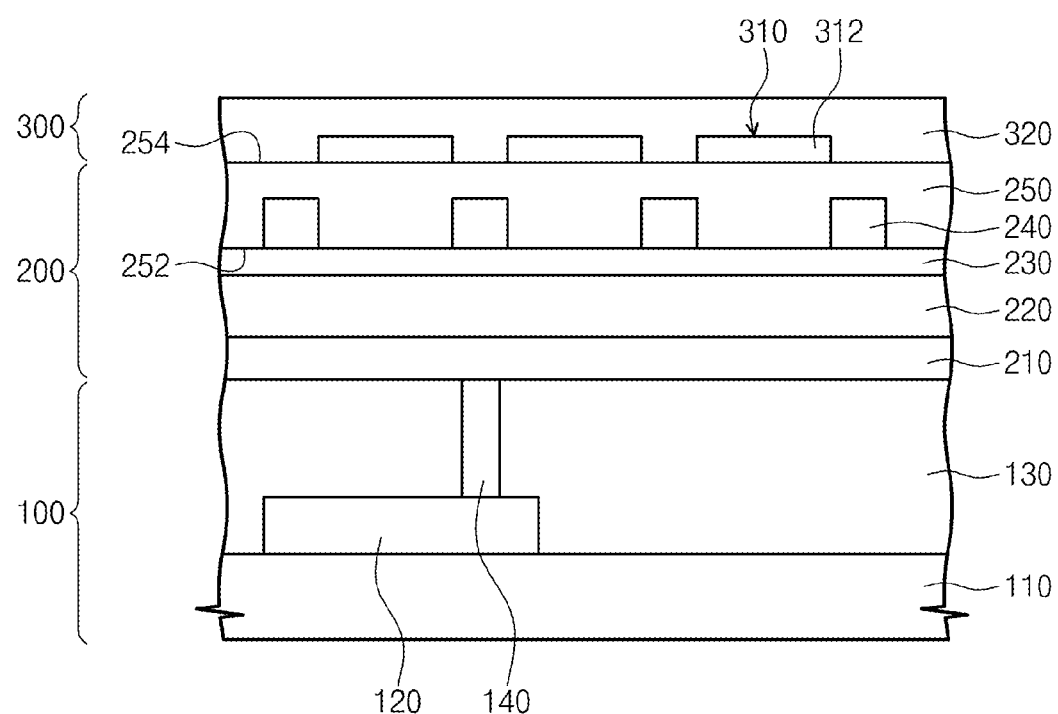
FIG. 1 is a cross-sectional view of a display device according to an embodiment of the present invention.

Objects, other objects, features, and advantages of the present invention will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the inventive concept to those skilled in the art.

It will be understood that when an element such as a layer, film, region, or substrate is referred to as being "on" another element, it can be directly on the other element or intervening elements may also be present. In the figures, elements are exaggerated for clarity of illustration.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the present invention. For example, an etching area illustrated in a right angle may have a round shape or a shape having a predetermined curvature. Also, though terms like a first, a second, and a third are used to describe various regions and layers in various embodiments of the present invention, the regions and the layers are not limited to these terms. These terms are used only to discriminate one region or layer from another region or layer. An embodiment described and exemplified herein includes a complementary embodiment thereof.

In the following description, the technical terms are used only for explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, exemplary embodiments of the present invention will be described below in more detail with reference to the accompanying drawings.

Display Device

FIG. 1 is a cross-sectional view of a display device according to an embodiment of the present invention.

Referring to FIG. 1, the display device may include a transistor area 100, a self-light emitting pixel area 200, and a reflective pixel area 300.

The transistor area 100 may include a thin film transistor 120 disposed on a transistor substrate 110, an interlayer dielectric 130 in which the thin film transistor 120 is buried, and a contact plug 140 electrically connecting the self-light emitting pixel area 200 and the thin film transistor 120 to each other. The transistor substrate 110 may be a transparent substrate. For example, the transistor substrate 110 may be a glass substrate or a plastic substrate. The interlayer dielectric 130 may include a silicon oxide.

The self-light emitting pixel area 200 may include a first electrode 210, a self-light emitting pixel layer 220, a second electrode 230, an auxiliary wire 240, and a first substrate 250.

The first electrode 210 may include at least one of a metal fiber such as Indium Tin Oxide (ITO), silver nanowire (AgNW), a carbon fiber, a graphene composite, and a conductive polymer. The self-light emitting pixel layer 220 may be disposed on the first electrode 210 and include an organic light emitting diode (OLED). The second electrode 230 may be disposed on the self-light emitting pixel layer 220 and have substantially the same material as that of the first electrode 210. For example, the second electrode 230 may include at least one of a metal fiber such as ITO and AgNW, a carbon fiber, a graphene composite, and a conductive polymer.

The auxiliary wire 240 may be disposed on the second electrode 230. According to an aspect of the present invention, the auxiliary wire 240 may have a surface resistance of about 10 ohm/sq or less that is less than a surface resistance of ITO based material that is generally used for the self-light emitting pixel layer 220. For example, the auxiliary wire 240 may include at least one of a metal based material such as aluminum (Al), silver (Ag), chromium (Cr), or copper (Cu), a metal fiber such as AgNW, a carbon fiber, and a graphene composite. According to an aspect of the present invention, the auxiliary wire 240 may have a height of about 0.1 µm to about 10 µm and a width of about 0.1 µm to about 500 µm.

The auxiliary wire 240 may be provided in plurality, and the first substrate 250 may be disposed on the auxiliary wires 240 so that the first substrate 250 may be filled between the plurality of auxiliary wires 240. The first substrate 250 may include polyimide, poly(ethyleneterephtalate) (PET), poly carbonate (PC), and poly(ethylenenaphthalate) (PEN). Also, the first substrate 250 may have transmittance of about 80% or more.

The first substrate 250 may include a first surface 252 adjacent to the transistor area 100 and a second surface 254 facing the first surface 252. The first surface 252 of the first substrate 250 may have a root mean square (rms) roughness of about 5 nm or less and a peak-to-valley height of about 20 nm or less.

As described above, the auxiliary wire 240 may be buried in the first substrate 250. The first surface 252 of the first substrate 250 in which the auxiliary wire 240 is buried may be flat to prevent a height difference due to the auxiliary wire 240 from occurring. Thus, the reflective pixel area 300 that will be described below and the self-light emitting pixel area 200 may be easily bonded to each other.

The reflective pixel area 300 may include a reflective pixel layer 310 and a second substrate 320. The reflective pixel layer 310 may include a plurality of pixel patterns 312. According to an aspect of the present invention, each of the auxiliary wires 240 may be disposed between the two pixel patterns 312 that are adjacent to each other. Also, each of the pixel patterns 312 may include a reflective optical filter. For example, the reflective optical filter may include a Fabry-Perot optical filter, a photonic crystal-type optical fiber, an absorptive optical filter, or a transmissive optical filter including a reflector. The second substrate 320 may be formed while the reflective pixel layer 310 is buried. The second substrate 320 may have substantially the same material as that of the first substrate 250. The second substrate 320 may include polyimide, poly(ethyleneterephtalate) (PET), poly carbonate (PC), and poly(ethylene naphthalate) (PET). Also, the second substrate 320 may have transmittance of about 80% or more.

Method of Manufacturing Display Device

Figure 2:
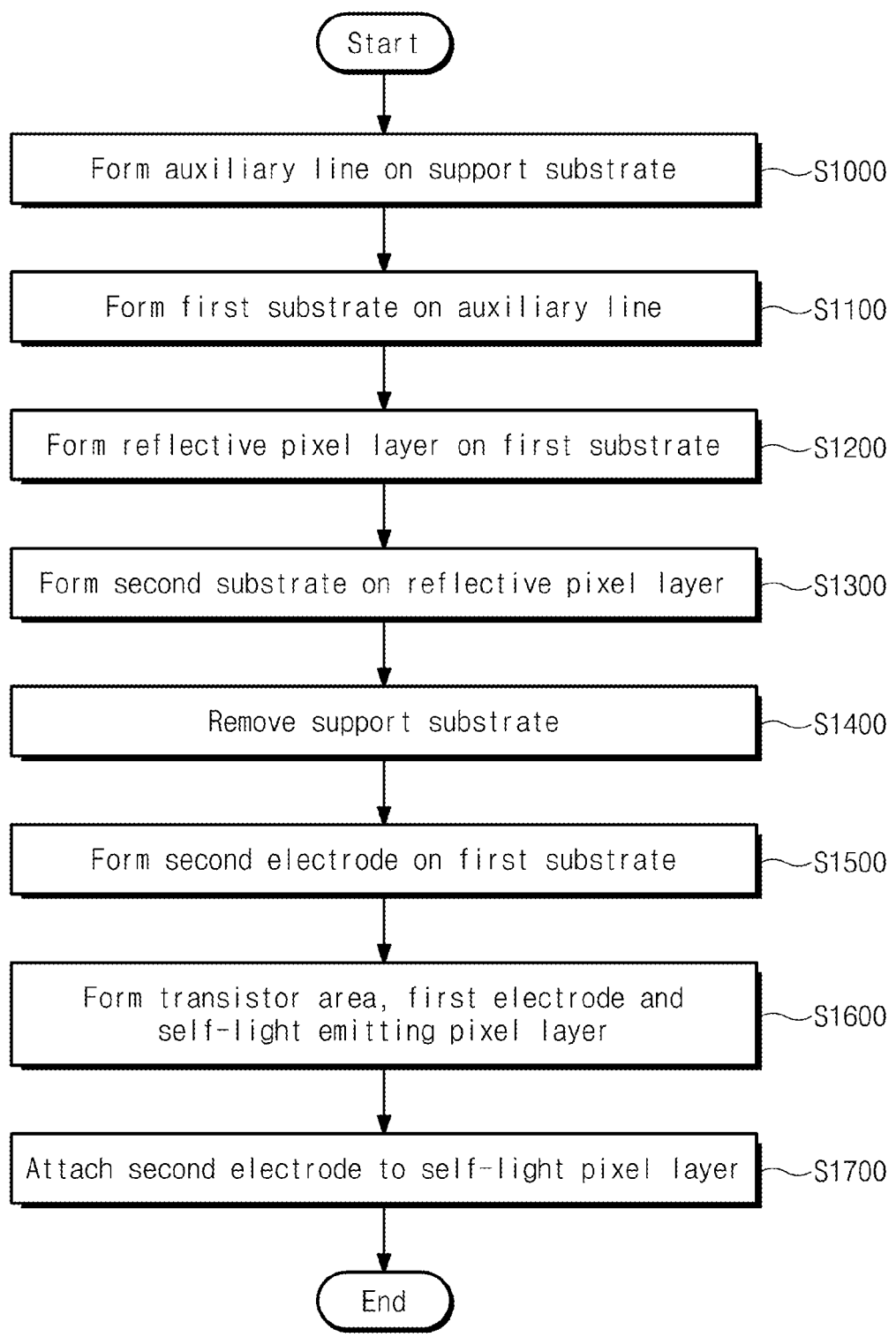
FIG. 2 is a flowchart illustrating a method of manufacturing the display device according to an embodiment of the present invention.

FIG. 2 is a flowchart illustrating a method of manufacturing the display device according to an embodiment of the present invention, and FIGS. 3 to 10 are cross-sectional view illustrating a method of manufacturing the display device according to an embodiment of the present invention.

Hereinafter, terms of "first" and "second" may be changed in their order to consistently describe with respect to the above-described terms.

Figure 3:
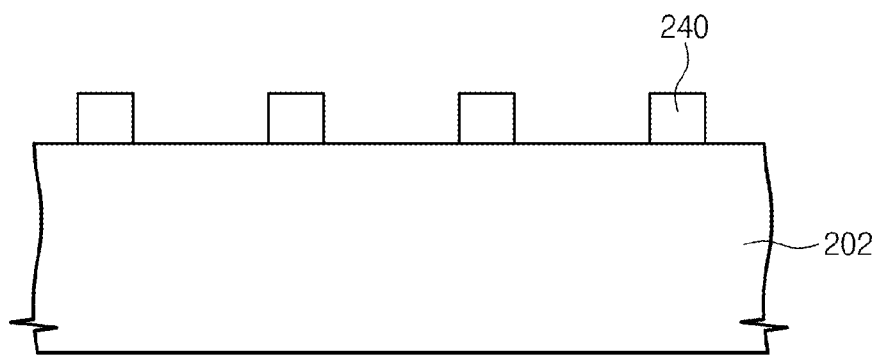
FIGS. 3 to 10 are cross-sectional view illustrating a method of manufacturing the display device according to an embodiment of the present invention.

Referring to FIGS. 2 and 3, in operation S1000, the auxiliary wires 240 may be formed on a support substrate 202. Each of the auxiliary wires 240 on the support substrate 202 may have a height of about 0.1 µm to about 10 µm and a width of about 0.1 µm to about 500 µm.

Each of the auxiliary wires 240 may have resistance less than that of ITO. According to an aspect of the present invention, the auxiliary wire 240 may be formed of a material having small surface resistance of about 10 ohm/sq or less. For example, the auxiliary wire 240 may include a metal such as aluminum (Al), silver (Ag), chromium (Cr), and copper (Cu), a metal fiber group such as silver nanowire (AgNW), a carbon fiber group, or a graphene composite.

For example, the auxiliary wire 240 may be formed on the support substrate 202 by using a thermal deposition or sputtering method. For another example, when the auxiliary wire 240 is formed by a liquid material, the auxiliary wire 240 may be formed on the support substrate 202 by using a printing method such as a gravure printing method, an electrohydrodynamic (EHD) printing method, or an inkjet printing method.

Figure 4:
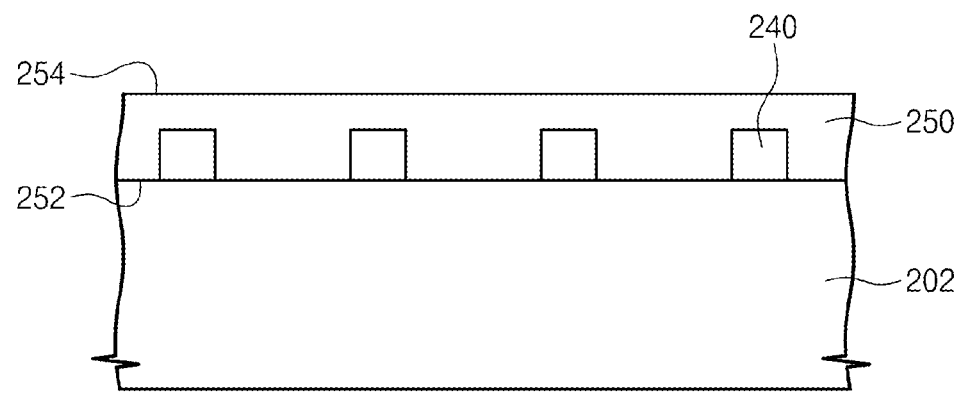

Referring to FIGS. 2 and 4, in operation S1100, a first substrate 250 filled between the auxiliary wires 240 may be formed on the support substrate 202.

In detail, a curable polymer may be formed on the support substrate 202 on which the auxiliary wires 240 are formed. For example, the curable polymer may include at least one selected from the group consisting of polyimide, poly(ethyleneterephtalate) (PET), poly carbonate (PC), and poly(ethylene naphthalate) (PEK).

The curable polymer may be formed on the support substrate 202 by using a printing method such as a gravure printing method, an electrohydrodynamic (EHD) printing method, or an inkjet printing method. And then, the curable polymer may be cured to form the first substrate 250.

According to an aspect of the present invention, the first substrate 250 may have direct transmittance of about 80% or more. The first substrate 250 may include a first surface 252 adjacent to the support substrate 202 and a second surface 254 facing the first substrate 252.

Figure 5:
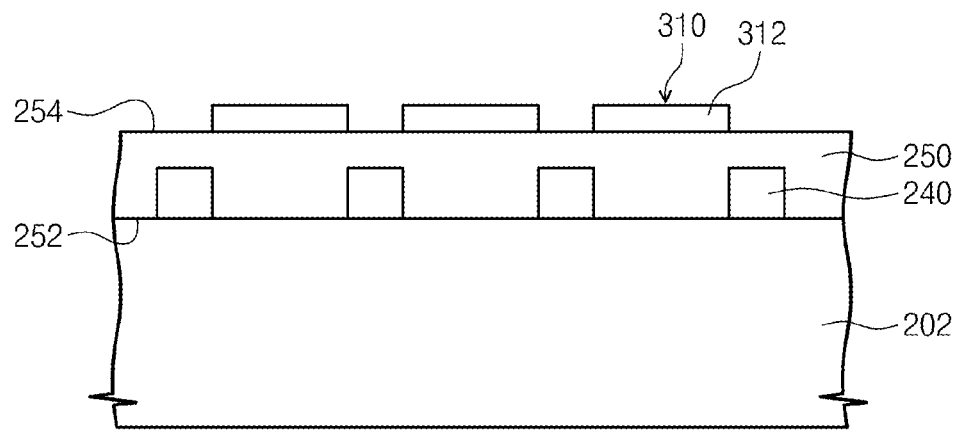

Referring to FIGS. 2 and 5, in operation S1200, a reflective pixel layer 310 may be formed on the second surface 254 of the first substrate 250.

The reflective pixel layer 310 may include a plurality of pixel patterns 312. According to an aspect of the present invention, each of the pixel patterns 312 may be formed between the two auxiliary wires 240 that are adjacent to each other. Also, each of the pixel patterns may include a reflective optical filter. For example, the reflective optical filter may include one of a Fabry-Perot optical filter, a photonic crystal-type optical filter, an absorptive optical filter, and a reflector.

Figure 6:
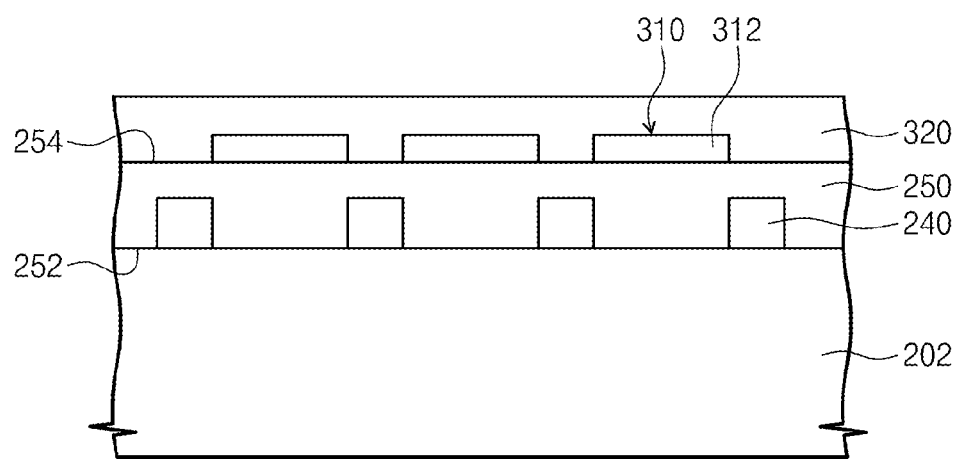

Referring to FIGS. 2 and 6, in operation S1300, a second substrate 320 in which the reflective pixel layer 310 is buried may be formed on the second surface 254 of the first substrate 250. The second substrate 320 may be formed through substantially the same process as that of forming the first substrate 250. Thus, detailed descriptions with respect to the process of forming the second substrate 320 will be omitted.

Figure 7:
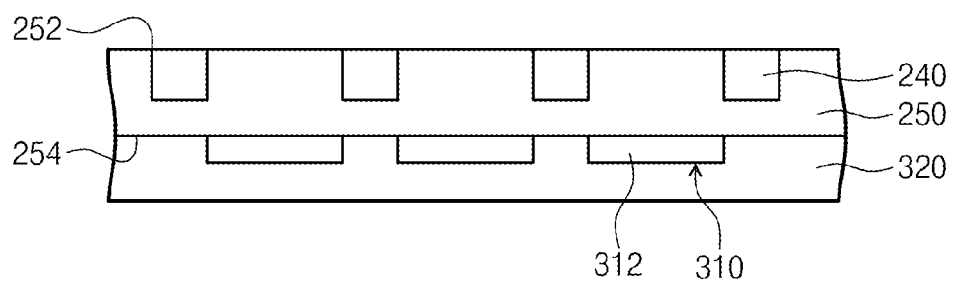

Referring to FIGS. 2 and 7, in operation S1400, the support substrate 202 may be removed from the first substrate 250.

According to an aspect of the present invention, the first surface 252 of the first substrate 250 from which the support substrate 202 is removed may have a root mean square (rms) roughness of about 5 nm or less and a peak-to-valley height of about 20 nm or less.

Figure 8:
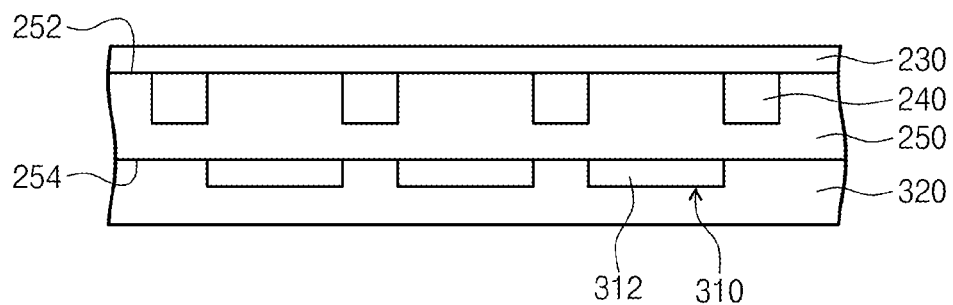

Referring to FIGS. 2 and 8, in operation S1500, a second electrode 230 may be formed on the first surface 252 of the first substrate 250.

The second electrode 230 may include a metal fiber such as Indium Tin Oxide (ITO), silver nanowire (AgNW), a carbon fiber, a graphene composite, and a conductive polymer.

For example, the second electrode 230 may be formed on the first surface 252 of the first substrate 250 by using a thermal deposition or sputtering method. For another example, when the second electrode 230 is formed by a liquid material, the second electrode 230 may be formed by using a printing method such as a gravure printing method, an EHD printing method, or an inkjet printing method.

Figure 9:
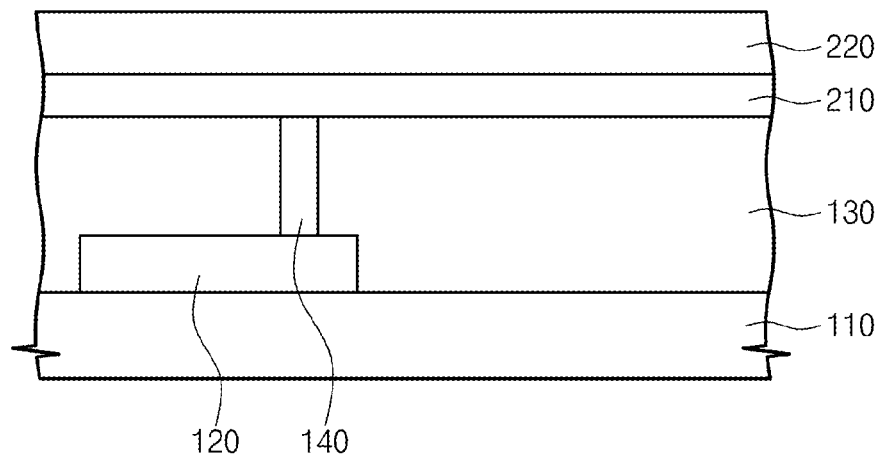

Referring to FIGS. 2 and 9, in operation S1600, the first electrode 210 and a self-light emitting pixel layer 220 may be formed on a transistor area 100.

In detail, a thin film transistor 120 may be formed on a transistor substrate 110. The transistor substrate 110 may be a transparent substrate. For example, the transistor substrate may be a glass substrate or a plastic substrate. An interlayer dielectric 130 may be formed on the transistor substrate 110 on which the thin film transistor 120 is formed. And then, a contact plug 140 passing through the interlayer dielectric 130 and electrically connected to the thin film transistor 120 may be formed. The first electrode 210 may be electrically connected to the contact plug 140. The first electrode 210 may be formed by using a method substantially the same as that of forming the second electrode 230. Thus, detailed descriptions with respect to the method of forming the first electrode 210 will be omitted.

In operation S1700, the self-light emitting pixel layer 220 may be formed on the first electrode 210. The self-light emitting pixel layer 220 may include an organic light emitting diode (OLED).

Figure 10:
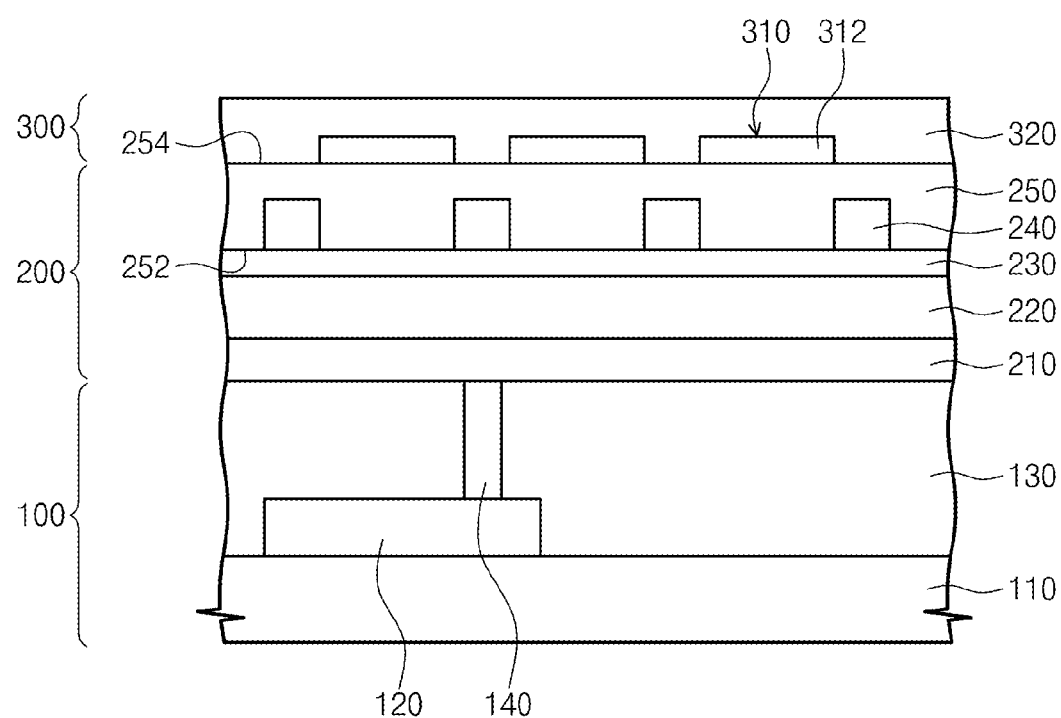

Referring to FIGS. 2 and 10, the second electrode 230 may be attached to the self-light emitting pixel layer 220. Therefore, the display device including the self-light emitting pixel area 200 and the reflective pixel area 300 may be manufactured.

In the embodiments according to concepts of the present invention, the auxiliary wire may be buried in the substrate, and the surface of the first substrate in which the auxiliary wire is buried may be flat to prevent a height difference due to the auxiliary wire from occurring. Therefore, the reflective pixel area and the self-light emitting pixel area may be easily bonded to each other.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description. Therefore, the preferred embodiments should be considered in descriptive sense only and not for purposes of limitation.

What is claimed is:

1. A display device comprising:
    a thin film transistor;
    a first electrode electrically connected to the thin film transistor;
    a self-light emitting pixel layer disposed on the first electrode;
    a second electrode disposed on the self-light emitting pixel layer;
    a substrate in which an auxiliary wire is buried, the substrate being disposed on the second electrode; and
    a reflective pixel layer disposed on the substrate.

2. The display device according to claim 1, wherein the substrate comprises polyimide, poly(ethyleneterephthalate) (PET), polycarbonate (PC), and poly(ethylenenaphthalate) (PEN).

3. The display device according to claim 1, wherein the substrate has transmittance of about 80% or more.

4. The display device according to claim 1, wherein a surface of the substrate contacting the self-light emitting pixel layer has roughness of about 5 nm or less, and a peak-to-valley height of about 20 nm or less.

5. The display device according to claim 1, wherein the auxiliary wire comprises aluminum (Al), silver (Ag), chromium (Cr), copper (Cu), silver nanowire (AgNW), a carbon fiber, or a graphene composite.

6. The display device according to claim 1, wherein the reflective pixel layer comprises a plurality of pixel patterns, and
    the auxiliary wire is disposed between the pixel patterns that are adjacent to each other.

7. The display device according to claim 1, wherein the auxiliary wire has surface resistance of about 10 ohm/sq or less.

8. The display device according to claim 1, wherein the auxiliary wire has a height of about 0.1 µm to about 10 µm and a width of about 0.1 µm to about 500 µm.

9. A method of manufacturing a display device, the method comprising:
    forming auxiliary wires on a support substrate;
    forming a first substrate filled between the auxiliary wires;
    forming a reflective pixel on the first substrate;
    forming a second substrate in which the reflective pixel is buried;
    removing the support substrate to expose one side of each of the auxiliary wires;
    forming a first electrode on the first substrate through which the one side of the auxiliary wire is exposed;
    successively laminating a thin film transistor, a second electrode, and a self-light emitting pixel layer; and
    disposing the first electrode on the self-light emitting pixel layer.

10. The method according to claim 9, wherein the auxiliary wires are formed on the support substrate through a thermal deposition, sputtering, or printing process.

11. The method according to claim 9, wherein the forming of the first substrate filled between the auxiliary wires comprises:
    applying a curable polymer on the support substrate in which the auxiliary wire is formed; and
    curing the curable polymer to form the first substrate.

12. The method according to claim 9, wherein the forming of the second substrate in which the reflective pixel is buried comprises:
    applying a curable polymer on the first substrate in which the reflective pixel is formed; and
    curing the curable polymer to form the second substrate.

* * * * *